(12) United States Patent
Prentice

(10) Patent No.: US 6,674,998 B2
(45) Date of Patent: Jan. 6, 2004

(54) SYSTEM AND METHOD FOR DETECTING AND CORRECTING PHASE ERROR BETWEEN DIFFERENTIAL SIGNALS

(75) Inventor: John S. Prentice, Palm Bay, FL (US)

(73) Assignee: Intersil Americas Inc., Milpitas, CA (US)

(*) Notice: Subject to any disclaimer, the term of this patent is extended or adjusted under 35 U.S.C. 154(b) by 532 days.

(21) Appl. No.: 09/747,138

(22) Filed: Dec. 21, 2000

(65) Prior Publication Data

US 2002/0042255 A1 Apr. 11, 2002

Related U.S. Application Data

(63) Continuation-in-part of application No. 09/677,975, filed on Oct. 2, 2000.

(51) Int. Cl.[7] .................................................. H04B 1/04
(52) U.S. Cl. ................. 455/114.2; 455/110; 455/115.1; 375/298
(58) Field of Search ........................... 455/67.11, 67.13, 455/63.1, 91, 110, 115.1, 86, 114.2; 375/261, 295, 298; 327/254; 331/45

(56) References Cited

U.S. PATENT DOCUMENTS

| | | | |
|---|---|---|---|
| 3,828,249 A | | 8/1974 | Alber et al. |
| 4,028,626 A | | 6/1977 | Motley et al. |
| 4,164,036 A | | 8/1979 | Wax |
| 5,264,798 A | | 11/1993 | Bey, Jr. et al. |
| 5,573,001 A | | 11/1996 | Petrofsky et al. |
| 5,574,755 A | * | 11/1996 | Persico ........................ 375/298 |
| 5,659,263 A | | 8/1997 | Dow et al. |
| 6,016,422 A | * | 1/2000 | Bartusiak ..................... 455/86 |
| 6,157,235 A | | 12/2000 | Bautista et al. |

FOREIGN PATENT DOCUMENTS

WO   WO 92/11704 A   7/1992

OTHER PUBLICATIONS

A. Abidi, "Direct–Conversion Radio Transceivers for Digital Communications", *IEEE Journal of Solid–State Circuits,* vol. 30, No. 12, Dec. 1995, pp. 1399–1410.

B. Razavi, "Design Considerations for Direct–Conversion Receivers", *IEEE Transactions on Circuits and Systems—II: Analog and Digital Signal Processing,* Vol 44, No. 6, Jun. 1997, pp. 428–435.

J. Cavers et al., "Adaptive Compensation for Imbalance and Offset Losses in Direct Conversion Transceivers", *IEEE Transactions on Vehicular Technology,* vol. 42, No. 4, Nov. 1993, pp. 581–588.

A. Bateman et al., "Direct Conversion Transceiver Design for Compact Low–Cost Portable Mobile Radio Terminals", *IEEE Veh. Tech. Conf.,* 1989, pp. 57–62.

(List continued on next page.)

*Primary Examiner*—Quochien Vuong
(74) *Attorney, Agent, or Firm*—Gary R Stanford

(57) ABSTRACT

A phase error detector that detects phase error between differential signals. A quadrature oscillator provides in-phase (I) and quadrature phase (Q) differential carrier signals and receives a phase error signal from the phase error detector. The oscillator maintains a quarter cycle phase delay between the I and Q carrier signals based on the phase error signal. The phase error detector includes a summing network and first and second bipolar transistor mixer circuits. The summing network develops four sum signals by summing respective pairs of the differential components of the I and Q carrier signals. A bias circuit biases the transistors to turn on at positive base voltages. The mixer circuits may include filter capacitors so that the transistors are responsive to positive base voltages. The mixer circuits develop polarity signals based on the sum signals, and the resulting phase error signal is the differential of the polarity signals.

23 Claims, 6 Drawing Sheets

OTHER PUBLICATIONS

S. Sampei et al., "Adaptive DC–Offset Compensation Algorithm for Burst Mode Operated Direct Conversion Receivers", IEEE Veh. Tech. Conf., 1992, pp. 93–96.

Tsukahara t et al, "A 2–V 2–GHZ Si–Bipolar Direct–Conversion Quadrature Modulator," IEEE Journal of Solid–State Circuits, IEEE Inc. New York, US, vol. 31, No. 2, Feb. 1996, pp. 263–267, XP0000597213, ISSN: 0018–9200, p. 263, left–hand column, line 40, right–hand column, line 2 figure 1.

PCT Notification of Transmittal of the International Search Report or the Declaration, dated May 7, 2002, 8 pages.

Floyd M. Gardner, Ph.D; Phaselock Techniques; Book; Aug. 1979; pp. 106–125; A Wiley–Interscience Publication; John Wiley & Sons; United States; ISBN: 0–471–04294–3.

PCT Written Opinion, dated Feb. 14, 2003, 5 pages.

* cited by examiner

| TRANSISTOR | VOLTAGE | DURATION |
|---|---|---|
| Q1 | $\frac{(T-\tau_{PW}-\frac{\tau_{PWD}}{2})}{T}V_{IP} + \frac{(T-\tau_{PW}-\frac{\tau_{PWD}}{2})}{T}V_{QP}$ | $\tau_{PW}-\tau_{ph}$ |
| Q3 | $\frac{(T-\tau_{PW}-\frac{\tau_{PWD}}{2})}{T}V_{In} + \frac{(T-\tau_{PW}-\frac{\tau_{PWD}}{2})}{T}V_{Qn}$ | $\tau_{PW}-\tau_{ph}$ |
| Q2 | $\frac{(T-\tau_{PW}-\frac{\tau_{PWD}}{2})}{T}V_{IP} + \frac{(T-\tau_{PW}-\frac{\tau_{PWD}}{2})}{T}V_{Qn}$ | $\tau_{PW}+\tau_{ph}-\frac{T}{2}$ |
| Q4 | $\frac{(T-\tau_{PW}-\frac{\tau_{PWD}}{2})}{T}V_{In} + \frac{(T-\tau_{PW}-\frac{\tau_{PWD}}{2})}{T}V_{Qp}$ | $\tau_{PW}+\tau_{ph}-\frac{T}{2}$ |

FIG. 9

SYSTEM AND METHOD FOR DETECTING AND CORRECTING PHASE ERROR BETWEEN DIFFERENTIAL SIGNALS

CROSS-REFERENCE TO RELATED APPLICATION(S)

The present application is a continuation-in-part (CIP) of U.S. Patent Application entitled "A Calibrated DC Compensation System For A Wireless Communication Device Configured In A Zero Intermediate Frequency Architecture", Ser. No. 09/677,975, filed Oct. 2, 2000, which is hereby incorporated by reference in its entirety. The present application is related to U.S. Patent Application entitled "Quadrature Oscillator With Phase Error Correction", Ser. No. 09/747,163, filed concurrently herewith, which is hereby incorporated by reference in its entirety.

FIELD OF THE INVENTION

The present invention relates to modulation techniques, and more particularly to phase error detection and correction of phase error between differential signals, such as in-phase and quadrature phase carrier signals of a quadrature oscillator.

DESCRIPTION OF RELATED ART

Many small networks are commonly connected through a set of wires. Wired networks provide a certain level of convenience but have many limitations such as various cable management and convenience issues. For various reasons, wireless LAN (WLAN) technology is becoming more popular. Radio frequency (RF) appears to be the technology of choice for establishing a viable WLAN. The typical environment for wireless communications, however, is very noisy and not optimal for communications. For example, most homes and workplaces include many electronic devices resulting in an electronically noisy environment that may interfere with WLAN communications, such as microwave ovens, garage door openers, radios, television sets, computer systems, etc. Further, the communication medium between wireless devices is dynamic and constantly changes. For example, most environments or rooms include multiple reflective services, creating multipath noise. Movement of items or devices or the like such as hands, bodies, jewelry, mouse pointers, etc., or activation of electronic devices, such as cooling fans or the like, affects the overall wireless communication path and potentially degrades wireless communication performance. In summary, wireless communications must be made through a dynamic and unpredictable medium.

In spite of the limitations of the wireless medium, consumers are demanding high-speed wireless applications and relatively high quality of service (QOS) applications. Such applications include media streams, which further include any combination of video and audio information and other data. Because of the dynamic and unpredictable environment through which wireless communications must be made, wireless communications are generally less robust and less reliable than corresponding wired communications. Also, A significant amount of overhead is required for successful wireless communications. For example, frames or packets of information submitted through the wireless media typically include a known preamble to enable the receiving device to measure the noise and distortion effects of the wireless medium. Collision detection techniques, such as commonly used in Ethernet wired environments, are not particularly useful in wireless communications since a transceiver is unable to receive a signal while transmitting. Therefore, many rules and timing constraints must be followed for wireless devices to communicate with each other in half duplex mode.

It is imperative that wireless transceivers utilize the wireless medium in the most efficient manner possible to maximize data throughput and to meet bandwidth requirements. In one technique, information is encoded onto an RF carrier by modulating the amplitude and phase angle. The phase modulation/demodulation is achieved by using pairs of mixers driven by quadrature local oscillator (LO) signals. The two phases of the local oscillator, designated I (in-phase) and Q (quadrature phase), are at the same frequency, but the Q phase is delayed one quarter cycle or period (90 degrees) with respect to the I phase carrier signal. The amount of data that can be transmitted at a given carrier frequency is proportional to the accuracy of the I/Q phase relationship.

In an exemplary embodiment, the two local oscillator phases are derived from a single voltage controlled oscillator (VCO) to obtain coherency. However, imperfections in the quadrature generation and/or distribution circuits typically cause quadrature phase errors. In order to obtain high data transmission rates, the I/Q phase relationship must not deviate from 90 degrees by more than few degrees. This has proven difficult to achieve in typical wireless transceiver configurations. For example, with a local oscillator frequency of 2.5 gigahertz (GHz), a timing error of 1.1 picoseconds (ps) is equivalent to one degree of phase error. Within the transceiver circuitry, a mismatch in parasitic capacitance of 11 fempto Farads (fF) across a 100-ohm resister can generate a one-degree phase error. An $f_t$ mismatch (where "t" is shown as Greek tau symbol or "$\tau$" in the Figures) of a bipolar junction transistor (BJT) of ten percent may also generate about one degree phase error at RF. A local oscillator chain of one or more buffer stages may cause accumulated timing errors between I and Q that may exceed several degrees.

It is desired to detect and reduce or otherwise eliminate phase errors between differential signals, such as the I/Q carrier signals of a quadrature oscillator. The reduction in phase error increases the amount of data that can be transmitted in accordance with the RF quadrature modulating technique.

SUMMARY OF THE INVENTION

A phase error detector according to an embodiment of the present invention may be used to detect and correct any phase error between positive and negative polarities of first and second differential signals. The first and second differential signals may be, for example, the carrier signals of a quadrature generator. The quadrature generator provides positive and negative in-phase (I) carrier signals and positive and negative quadrature phase (Q) carrier signals and receives a phase error signal. The quadrature oscillator attempts to maintain the I and Q carrier signals at a one-quarter period phase differential with respect to each other based on the phase error signal. It is appreciated, however, that phase error detectors according to embodiments of the present invention may be employed for other types of circuits and applications, such as phase-locked loop (PLLs), voltage controlled oscillators (VCOs), etc.

The phase error detector includes a summing network and first and second mixer circuits. The summing network develops four sum signals by summing the positive polarity signal of the first differential signal with the positive polarity signal of the second differential signal, the negative polarity signal of the first differential signal with the negative polarity signal of the second differential signal, the positive polarity signal of the first differential signal with the negative polarity signal of the second differential signal, and the negative polarity signal of the first differential signal with the positive polarity signal of the second differential signal. The first mixer circuit develops a first polarity signal of the phase error signal based on the first and second sum signals, and the second mixer circuit develops a second polarity signal of the phase error signal based on the third and fourth sum signals. The resulting phase error signal is the differential of the first and second polarity signals.

In one embodiment, the summing network removes DC from the first, second, third and fourth sum signals. The first mixer circuit is responsive to the positive portion of the first and third sum signals and develops the first polarity signal of the phase error signal as a combined signal. Likewise, the second mixer circuit is responsive to the positive portion of the second and fourth sum signals and develops the second polarity signal of the phase error signal as a combined signal. In a particular embodiment, for example, the sum signals are pulsed voltage signals that activate transistor switches. The transistors draw averaged and combined current signals through a bias resistor to develop a phase error polarity signal.

In another embodiment, the summing network comprises an impedance bridge network. In a more specific embodiment, the impedance bridge network is a capacitive bridge network that includes first, second, third and fourth capacitive legs coupled together at first, second, third and fourth primary junctions. The positive polarity signal of the first differential signal is received at the first primary junction coupling the first and fourth capacitive legs. The negative polarity signal of the first differential signal is received at the third primary junction coupling the second and third capacitive legs. The positive polarity signal of the second differential signal is received at the second primary junction coupling the first and second capacitive legs. The negative polarity signal of the second differential signal is received at the fourth primary junction coupling the third and fourth capacitive legs. Each capacitive leg includes two capacitors coupled together at an intermediate junction to provide a corresponding sum signal. In particular, the first capacitive leg provides the first sum signal, the second capacitive leg provides the fourth sum signal, the third capacitive leg provides the third sum signal, and the fourth capacitive leg provides the second sum signal at respective intermediate junctions. The two capacitors of each capacitive leg of the capacitive network may be matched with each other, which is particularly useful when the input impedance of the mixers is primarily capacitive. Also, all the capacitors of the capacitive bridge network may be matched.

Each of the mixer circuits may include a matched pair of bipolar transistors with common-coupled collectors. The base of each transistor receives a corresponding one of the four sum signals. In particular, the first and third sum signals are provided to one matched pair of transistors to develop the first polarity signal and the second and fourth sum signals are provided to the other matched pair of transistors to develop the second polarity signal of the phase error signal. A bias circuit is provided to bias the transistors of the mixers. In one embodiment, a pair of bias resistors are each coupled between a power supply signal and a respective one of the common-coupled collectors of the first and second matched pairs of bipolar transistors. The bias resistors may be matched with each other for symmetry. The bias resistors may alternatively be inductors or the like or may be collectively replaced by a current mirror.

A bias circuit may be provided and coupled to the mixers. In one embodiment, four bias devices are coupled between a bias signal and a respective one of the intermediate junctions of the capacitive legs of the capacitive bridge network. The bias devices may be resistors, but may alternatively be current sources or inductors or the like. For the bipolar transistor-based configuration of the mixers, the bias devices are each coupled to a bias signal and to a respective base of the four transistors of the mixer circuits. Two filters may be provided, each coupled between the collectors and emitters of a respective one of the first and second matched pairs of bipolar transistors. The filters divert AC current to ground so that only DC current flows through the bias resistors. The filters may be capacitors or other more sophisticated types of filters.

A quadrature generator system with phase error detection feedback in accordance with embodiments of the present invention includes a quadrature generator and a phase error detector. The quadrature generator develops positive and negative square-wave I carrier signals and positive and negative square-wave Q carrier signals and receives a differential phase error signal for correcting phase error between the I and Q carrier signals. The phase error detector is similar to that described above and includes first and second mixer circuits and a summing circuit for providing four sum signals. The first mixer circuit combines first and second sum signals and develops a first polarity signal of a differential phase error signal. The second mixer circuit combines third and fourth sum signals and develops a second polarity signal of the differential phase error signal.

It is appreciated that a radio transceiver may be implemented with a phase error detector in accordance with the present invention. The receiver includes I and Q radio frequency (RF) mixers that receive the I and Q carrier signals, respectively, to separate the carrier signals from the I and Q portions of the received signal. The transmitter includes similar I and Q RF mixers that mix the I and Q carrier signals, respectively, with I and Q transmit signals, respectively, to develop a combined signal for transmission. The radio transceiver includes a quadrature oscillator with phase error detection feedback in accordance with embodiments of the present invention that enables accurate I and Q carrier signals. It is noted that a single phase error detector may be employed for both transmit and receive circuits. A switched phase error detector is contemplated for half-duplex operation in which only one of the transmit and receive circuits is operational at any given time. Alternatively, separate transmit and receive phase error detectors may be provided adjacent corresponding transmit and receive mixers for improved accuracy.

The present disclosure also describes a method of providing a phase error signal indicative of any phase error between positive and negative polarities of a first and second differential signals. The first and second differential signals each include positive and negative polarity signals. The method includes combining the positive polarity signals of the first and second differential signals and providing a first sum, combining the negative polarity signals of the first and second differential signals and providing a second sum, combining a first positive polarity signal and a first negative polarity signal of the first and second differential signals and providing a third sum, and combining a second positive polarity signal and a second negative polarity signal of the first and second differential signals and providing a fourth sum. The method further includes mixing the first and third sums to generate a first polarity phase error signal, mixing the second and fourth sums to generate a second polarity phase error signal, and providing the phase error signal as the difference between the first and second polarity phase error signals.

The combining of the respective I and Q signals may include summing the respective signals together. The method may also include removing DC from the first, second, third and fourth sums prior to mixing. The method may further include generating a first signal responsive to a positive portion of the first sum, generating a second signal responsive to a positive portion of the third sum, and combining the first and second signals to achieve the first polarity phase error signal. Also, the method may include generating a third signal responsive to a positive portion of the second sum, generating a fourth signal responsive to a positive portion of the fourth sum, and combining the third and fourth signals to achieve the second polarity phase error signal.

BRIEF DESCRIPTION OF THE DRAWINGS

A better understanding of the present invention can be obtained when the following detailed description of the preferred embodiment is considered in conjunction with the following drawings, in which:

FIG. 9 is a table that summarizes the positive amplitude excursion above the bias signal and the duration of the pulse for each transistor base voltage in response to the I and Q carrier signals of FIG. 6.

DETAILED DESCRIPTION OF EMBODIMENT (S) OF THE INVENTION

Figure 1:
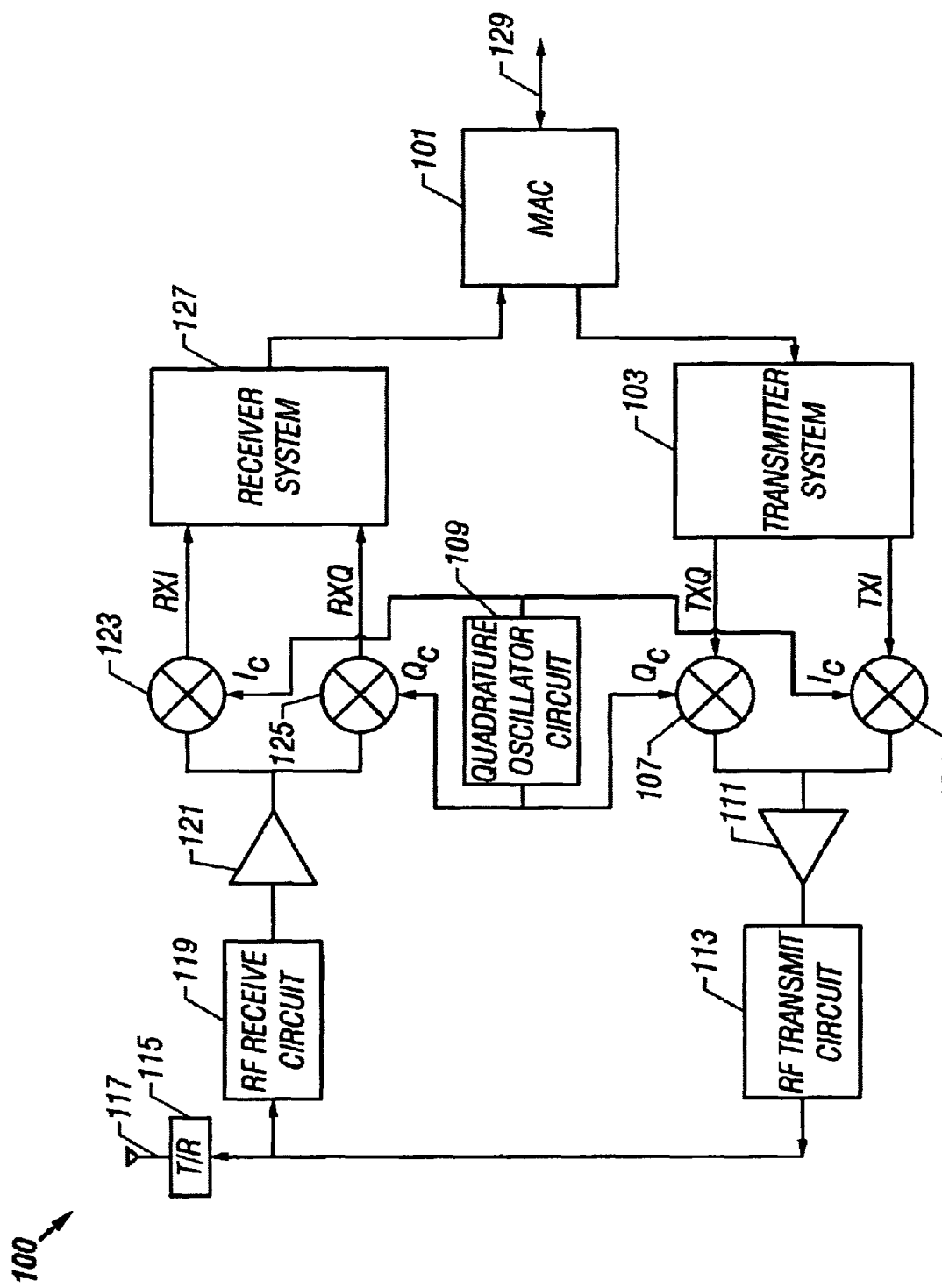
FIG. 1 is a simplified block diagram of an exemplary wireless transceiver that includes one or more phase error detectors implemented according to an embodiment of the present invention.

FIG. 1 is a simplified block diagram of an exemplary wireless transceiver 100 that includes one or more phase error detectors 300 (FIG. 3) implemented according to an embodiment of the present invention. The wireless transceiver 100 may utilize any desired carrier frequency and modulation technique to achieve any of the several corresponding data throughputs. For example, the wireless transceiver 100 may be configured to operate according to the Institute of Electrical and Electronics Engineers (IEEE) 802.11 with a carrier frequency of approximately 2.4 gigahertz (GHz) and with data throughputs of 1, 2, 5.5 or 11 megabits per second (Mbps). Alternatively, the wireless transceiver 100 may be configured according to IEEE 802.11 with a carrier frequency of approximately 5 GHz for achieving data throughputs of 6, 12, 24, 36 or 54 megabits per second (Mbps). The direct sequence spread spectrum (DSSS) modulation technique may be used, although many communication and modulation techniques and standards are contemplated. It is appreciated that the present invention is not limited to the specific embodiments described herein and may be applied to detection and correction of phase error for any type of system employing phase modulation techniques.

Digital data sent from or received by the wireless transceiver 100 via an interface 129 is processed through a medium access control (MAC) device 101. For transmission, the MAC device 101 asserts digital data signals to a transmitter system 103, which includes an encoder (not shown) that formulates the data into packets for transmission, and a spreading encoder (not shown) that uses a quadrature generation technique to provide in-phase (I) and quadrature phase (Q) signals on respective I and Q channels. The spreading decoder is configured in accordance with any one of various known spreading algorithms. The I and Q channel signals are provided to respective digital-to-analog converters (DACs) (not shown) that assert respective I and Q channel analog signals. The I and Q channel analog signals are filtered by the transmitter system 103, which provides corresponding TXI and TXQ signals, respectively, to respective inputs of an I channel mixer 105 and a Q channel mixer 107.

The quadrature oscillator circuit 109 generates two separate RF carrier signals, including an in-phase carrier signal $I_C$ in a quadrature phase carrier signal $Q_C$. The $I_C$ and $Q_C$ carrier signals are intended to be 90 degrees out of phase with respect to each other (i.e., a quarter cycle or period differential). The $I_C$ signal is provided to another input of the I channel mixer 105 and the $Q_C$ signal is provided to another input of the Q channel mixer 107. The I channel mixer 105 combines the $I_C$ signal with the TXI signal to up-convert the I channel transmission signal to the desired RF range for transmission. The Q channel mixer 107 combines the $Q_C$ signal with the TXQ signal to up-convert the Q channel signal to the desired RF range for transmission. The outputs of the I/Q channel mixers 105, 107 are combined at the input of an amplifier 111. The amplifier 111 asserts a combined amplified transmit signal to the input of an RF transmit circuit 113, which asserts an amplified RF signal to an antenna 117 through a transmit/receive (T/R) switch 115 when in a transmit mode.

The T/R switch 115 is selected to receive signals from the antenna 117 when in a receive mode and to provide the received signal to the input of an RF receive circuit 119. The RF receive circuit 119 provides the received signal to an amplifier 121, which asserts an amplified RF receive signal to respective inputs of an I channel mixer 123 and a Q channel mixer 125. The quadrature oscillator circuit 109 asserts the $I_C$ signal to another input of the I channel mixer 123 and asserts the $Q_C$ signal to another input of the Q channel mixer 125. The I channel mixer 123 splits the $I_C$ signal from an I channel receive signal RXI in the received signal and provides the RXI signal to a receiver system 127. In a similar manner, the Q channel mixer 125 splits the $Q_C$ signal from the Q channel receive signal RXQ in the received signal and provides the RXQ signal to another input of the receiver system 127.

The receiver system 127 generally performs the opposite functions of the transmitter system 103. In particular, the receiver system 127 includes analog-to-digital converters (ADCs) (not shown) that convert the analog RXI and RXQ signals to digital format. The receiver system 127 further includes a spreading decoder (not shown) that retrieves encoded packets and a packet decoder (not shown) that retrieves the packet payloads from the packets and generates a stream of received data signals. The received data signals from the receiver system 127 are provided to a receive input of the MAC device 101, which provides the received data signals to a corresponding device across the interface 129. The MAC interface 129 may be incorporated internally within a device, such as on a PC CARD or the like, or may be external with appropriate external connectors, such as according to USB or the like.

Figure 2:
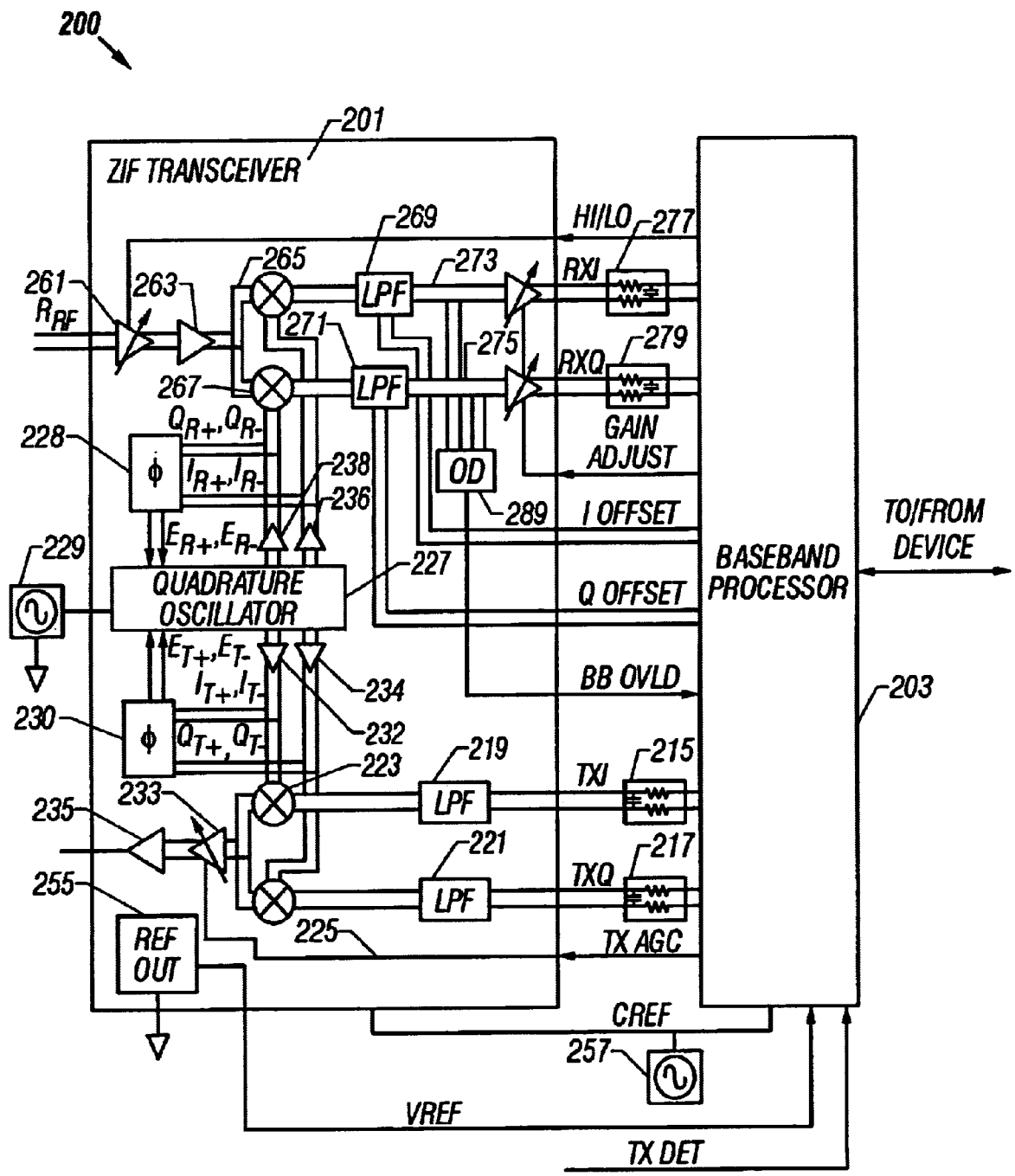
FIG. 2 is a more detailed schematic and block diagram of a wireless transceiver in a Zero Intermediate Frequency (ZIF) architecture and implemented according to an embodiment of the present invention.

FIG. 2 is a schematic and block diagram of a wireless transceiver 200 that represents a more detailed embodiment of the wireless transceiver 100 and that includes one or more phase error detectors implemented according to an embodiment of the present invention. It is understood that the wireless transceiver 200 is applicable to WLAN configurations or any other type of radio or wireless communications for other types of applications. The wireless transceiver 200 is implemented as a zero intermediate frequency (ZIF) architecture including a ZIF transceiver 201 and a baseband processor 203. The ZIF architecture enables a simplified configuration by entirely eliminating intermediate frequency (IF) logic and associated circuitry. In this manner, only two primary modules, chips, or ICs (transceiver and processor) are utilized in the ZIF architecture to enable wireless communications. The ZIF transceiver 201 includes a quadrature oscillator 227 with phase error correction as further described below. The baseband processor 203 performs many of the functions of the receiver system 127, the transmitter system 103 and the MAC device 101 and will not be described in detail.

The wireless transceiver 200 may utilize any desired carrier frequency and modulation technique to achieve any of several corresponding data throughputs. For example, the wireless transceiver 200 may be configured to operate according to the Institute of Electrical and Electronics Engineers (IEEE) 802.11 with a carrier frequency of approximately 2.4 gigahertz (GHz) and with data throughputs of 1, 2, 5.5 or 11 Megabits per second (Mbps). Alternatively, the wireless transceiver 200 may be configured according to IEEE 802.11 with a carrier frequency of approximately 5 GHz for data throughputs of 6, 12, 18, 24, 36 or 54 Mbps. In the embodiment shown, the wireless transceiver 200 operates in accordance with IEEE 802.11 at a carrier frequency of 2.4 GHz with data throughput rates of 1, 2, 5.5 or 11 Mbps. The direct sequence spread spectrum (DSSS) modulation technique is used in the embodiment shown, although it is understood that the present invention is not limited to any particular communication or modulation technique or standard.

Digital data sent from or received by the wireless transceiver 200 is processed by the baseband processor 203. For transmission, the baseband processor 203 performs the functions described above for the transmitter system 103 and converts data received into respective I and Q channel analog signals as previously described. The I channel analog output signal is provided to an anti-aliasing low-pass filter (AA LPF) 215, which provides an I channel transmit signal TXI to an LPF 219 within the ZIF transceiver 201. The broadband processor 203 asserts the Q channel analog output signal to another AA LPF 217, which provides a Q channel transmit signal TXQ to the input of another LPF 221 within the ZIF transceiver 201.

An external voltage controlled oscillator (VCO) 229 provides an output local oscillator (LO) signal at approximately 4.8–5 GHz to an input of the quadrature oscillator 227. In one embodiment, a reference crystal is used to tune the VCO 229 by a voltage control to generate the 4.8–5 GHz LO signal. It is noted that the quadrature oscillator 109 collectively represents a simplified version of the quadrature oscillator 227 and the VCO 229. The quadrature oscillator 227 divides the LO signal by two and generates four separate 2.4 GHz carrier signals, including two in-phase (I) carrier signals, and two receive quadrature (Q) carrier signals, each comprising a differential signal. In particular, the I carrier signals include an differential I transmit carrier signal ($I_{T+}$, $I_{T-}$) and an differential I receive carrier signal ($I_{R+}$, $I_{R-}$) and the Q carrier signals include a differential Q transmit carrier signal ($Q_{T+}$, $Q_{T-}$) and a differential Q receive carrier signal ($Q_{R+}$, $Q_{R-}$). The I and Q carrier signals are intended to be 90 degrees out of phase with respect to each other. The I transmit carrier signal is provided to one input of an I channel mixer 223 (corresponding to mixer 105) through a driver 232, and the Q transmit carrier signal is provided to one input of a Q channel mixer 225 (corresponding to mixer 107) through another driver 234. The other input of the I channel mixer 223 receives the output of the LPF 219 and the other input of the Q channel mixer 225 receives the output of the LPF 221. The I channel mixer 223 combines the I carrier signal with the I channel transmit signal to up-convert the I channel from baseband to 2.4 GHz radio frequency (RF). The Q channel mixer 225 combines the Q carrier signal with the Q channel transmit signal to up-convert the Q channel from baseband to 2.4 GHz RF. The outputs of the I/Q channel mixers 223, 225 are combined at the input of a variable gain amplifier (VGA) 233. The VGA 233 asserts an amplified transmit signal to the input of a fixed-gain amplifier 235, which provides an output transmit signal to external circuitry for transmission, such as the RF transmit circuit 113 previously described.

A transmit detect (TX DET) feedback signal is asserted from external transmit circuitry, such as the RF transmit circuit 113, back to the baseband processor 203. The baseband processor 203 conducts a power control algorithm that detects the transmitted output signal via the TX DET signal and provides a feed forward transmit automatic gain control (TX AGC) signal to the ZIF transceiver 201 to control the gain of the VGA 233. Further, the ZIF transceiver 201 includes a voltage reference source 255 that provides a voltage reference (VREF) signal for the ZIF transceiver 201 and for the baseband processor 203. The VREF signal may be any convenient voltage, such as 1.2 volts or the like. Also, a clock source 257 provides a clock reference (CREF) signal to the ZIF transceiver 201 and the baseband processor 203.

An RF input signal RRF is received from external circuitry, such as the RF receive circuit 119 or the like, at the input of a variable LNA 261 within the ZIF transceiver 201. The LNA 261 asserts its output to the input of a fixed-gain LNA 263. The LNA 263 asserts the amplified RF receive signal to respective inputs of an I channel mixer 265 (corresponding to mixer 123) and a Q channel mixer 267 (corresponding to mixer 125). The quadrature oscillator 227 asserts the I receive carrier signal ($I_{R+}$, $I_{R-}$) to another input of the I channel mixer 265 through a driver 236 and the Q receive carrier signal ($Q_{R+}$, $Q_{R-}$) to another input of the Q channel mixer 267 through another driver 238. The I channel mixer 265 splits the I carrier frequency from the I channel output signal in the RF receive signal and provides the I channel output signal to an LPF 269. In a similar manner, the Q channel mixer 267 splits the Q carrier frequency from the Q channel output signal in the RF receive signal and provides the Q channel output signal to an LPF 271.

The output of the LPF 269 is provided to the input of a variable baseband automatic gain control (BB AGC) amplifier 273. In a similar manner, the LPF 271 asserts its output to the input of another BB AGC amplifier 275. The BB AGC amplifier 273 asserts an amplified I channel analog receive signal (RXI) to the input of an I channel receiver AA LPF 277, which asserts its output to an I channel input of the baseband processor 203. The BB AGC amplifier 275 asserts an amplified Q channel analog receive signal (RXQ) to the input of a Q channel AA LPF 279, which provides its output to a Q channel input of the baseband processor 203. The baseband processor 203 performs the functions of the receiver system 127, previously described, and generates a stream of received data signals.

An overload detector (OD) 289 within the ZIF transceiver 201 has first and second inputs coupled to the respective outputs of the LPF 269 and LPF 271 to detect an overload in the received input signal. The overload detector 289 asserts a baseband overload (BB OVLD) signal to a compensation system within the baseband processor 203. In this manner, the compensation system detects an overload of the received signal and asserts a HI/LO signal to control the variable LNA 261 of the ZIF transceiver 201. In the embodiment shown, the variable LNA 261 has an approximate 33 decibel (dB) step differential between a high gain (HI) and a low gain (LO). The gain is initially set high to detect weak signals and is switched to low gain upon certain conditions if the receive signal causes an overload condition as detected by the overload detector 289.

The compensation system also controls the gain of the received signal to a target power level by asserting an analog feedback gain control signal GAIN ADJUST to control the gain of both of the BB AGC amplifiers 273, 275. A single gain control signal is provided to both of the BB AGC amplifiers 273, 275 so that the gain of the I and Q channels of the receive signal appropriately track one another. The compensation system further asserts respective digital I and Q channel DC offset signals, I OFFSET and Q OFFSET to the LPF 269 and the LPF 271, respectively. In this manner, the compensation system attempts to measure and reduce or otherwise eliminate DC offsets in both the I and Q channels of the receive signal within the ZIF transceiver 201.

In the embodiment shown, a phase ($\phi$) error detector 228 receives the differential Q receive carrier signal ($Q_{R+}$, $Q_{R-}$) and the differential I receive carrier signal ($I_{R+}$, $I_{R-}$) and generates a differential receive phase error signal $E_R$ with positive and negative components ($E_{R+}$, $E_{R-}$). Likewise, another phase error detector 230 receives the differential Q transmit carrier signal ($Q_{T+}$, $Q_{T-}$) and the differential I receive carrier signal ($I_{T+}$, $I_{T-}$) and generates a differential transmit phase error signal $E_T$ with positive and negative components ($E_{T+}$, $E_{T-}$). Each phase error detector 228, 230 measures the relative phase error from quadrature between the corresponding differential I and Q carrier signals and converts the measured error to a phase error voltage, which is the DC component of the output signal of the phase error detector 228, 230. The phase error signals $E_R$ and $E_T$ are provided to the quadrature oscillator 227, which adjusts the I and Q carrier signals accordingly, as further described below.

In the embodiment shown, the phase error detector 228 is located near the receive mixers 265, 267 for a more accurate phase error determination at the receive circuitry. Likewise, the phase error detector 230 is located near the transmit mixers 223, 225 a more accurate phase error determination at the transmit circuitry. The use of separate detectors located at or near the mixers provides the highest level of accuracy for phase error detection and correction. It is noted, however, that various embodiments and configurations of the phase error detector function are contemplated. In one alternative, only one of the phase error detectors 228, 230 is used to provide one feedback phase error signal for both transmit and receive mixers. Alternatively, the phase error detectors 228, 230 are replaced by a single phase error detector. The single phase error detector may be located anywhere on the ZIF transceiver 201, such as at the input or within the quadrature oscillator 227. For half-duplex operation, a single switched phase error detector is contemplated for switching between transmit and receive modes of operation.

Figure 3:
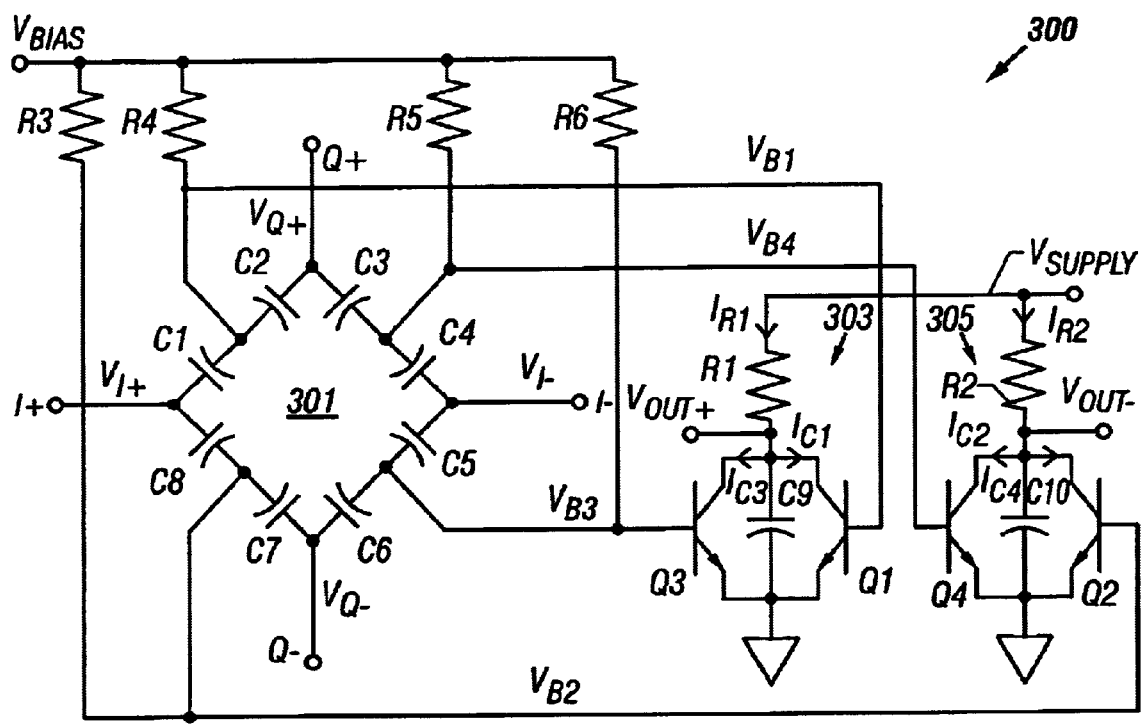
FIG. 3 is a more detailed schematic diagram of a phase error detector that may be utilized as any of the phase error detectors of FIG. 2.

FIG. 3 is a schematic diagram of an exemplary phase error detector 300, which may be used as either of both of the phase error detectors 228 and 230. The phase error detector 300 receives a differential I receive carrier signal (I+, I−) and a differential Q transmit carrier signal (Q+, Q−) and asserts a differential output phase error signal $V_{OUT}$ with two polarities $V_{OUT+}$ and $V_{OUT-}$, respectively. When employed as the phase error detector 228, the input signals are the $I_{R+}$, $I_{R-}$, $Q_{R+}$ and $Q_{R-}$ signals and the output signal becomes the $E_{R+}$ and $E_{R-}$ signals. When employed as the phase error detector 230, the input signals are the $I_{T+}$, $I_{T-}$, $Q_{T+}$ and $Q_{T-}$ signals and the output signal becomes the $E_{T+}$ and $E_{T-}$ signals. As described previously, any one or more phase error detectors may be used within the wireless transceiver 100 and/or the wireless transceiver 200.

It is noted that the phase error detector 300 is illustrated as detecting and correcting phase error between the I and Q signals of a quadrature oscillator or generator. It is appreciated, however, that a phase error detector and phase error correction techniques described herein are applicable to other types of systems, such as such as phase-locked loop (PLLs), voltage controlled oscillators (VCOs), and the like. In general, phase error detection and correction as described herein is applicable to detect and correct phase error between any two differential signals, each having a positive polarity signal and a negative polarity signal.

A voltage source or supply signal $V_{SUPPLY}$ is provided to two mixer circuits 303 and 305. In particular, the $V_{SUPPLY}$ signal is provided to one side each of bias resisters R1 and R2. The other side of the bias resister R1 and is coupled to the collectors of two NPN bipolar junction transistors (BJTs) Q1 and Q3 and to one end of a filter capacitor C9 and this junction develops the $V_{OUT+}$ signal. In this manner, the transistors Q1 and Q3 have common-coupled collectors. The emitters of the transistors Q1 and Q3 and the other side of the capacitor C9 are coupled to ground. The other side of the resister R2 is coupled to the collectors of two additional NPN BJTs Q2 and Q4 (common-coupled collectors) and to one side of a filter capacitor C10 and this junction develops the $V_{OUT-}$ signal. The emitters of the transistors Q2, Q4 and the other side of the filter capacitor C10 are coupled to ground.

In the embodiment shown, the transistors Q1–Q4 are matched BJTs to achieve symmetry. Other types of transistor devices are contemplated, such as PNP, metal oxide semiconductor (MOS) type or field effect transistors (FETs) or the like. The bias resistors R1 and R2 may be replaced by other types of bias devices such as inductors or the like. Also, a single current mirror may replace both of the bias resistors R1, R2. The capacitors C9, C10 may be replaced by any suitable filter circuit.

The I+, I− and Q+, Q− input signals are provided to respective primary junctions of a summing circuit or network 301. The summing network 301 may be an impedance bridge network, such as a capacitive bridge network as shown including eight capacitors C1–C8. It is noted that although a capacitive bridge network is shown, other summing networks or circuits are contemplated. The summing network 301 includes four capacitive legs coupled together at four primary junctions. The first capacitive leg includes capacitors C1 and C2 coupled together at a first intermediate junction. The second capacitive leg includes capacitors C3 and C4 coupled together at a second intermediate junction. The third capacitive leg includes capacitors C5 and C6 coupled together at a third intermediate junction. The fourth capacitive leg includes capacitors C7 and C8 coupled together at a fourth intermediate junction. The I+ signal is coupled to one side each of capacitors C1 and C8. The I− signal is coupled to one side each of capacitors C4 and C5. The Q+ signal is coupled to one side each of capacitors C2 and C3. The Q− signal is coupled to one side each of capacitors C6 and C7.

A bias signal $V_{BIAS}$ is provided to one side each of bias transistors R3, R4, R5 and R6. The bias resistors R3–R6 may be replaced by other types of bias devices, such as inductors or current sources or the like. The other side of resister R4 is coupled to the other sides of the capacitors C1 and C2 at the first intermediate junction and to the base of the transistor Q1 to develop a base voltage signal $V_{B1}$. The other side of the resister R5 is coupled to the other sides of the capacitors C3 and C4 at the second intermediate junction and to the base of the transistor Q4 to develop a base voltage signal $V_{B4}$. The other side of the resister R6 is coupled to the other sides of the capacitors C5 and C6 at the third intermediate junction and to the base of the transistor Q3 to develop a base voltage signal $V_{B3}$. The other side of the bias resister R3 is coupled to the other sides of the capacitors C7 and C8 at the fourth intermediate junction and to the base of the transistor Q3 to develop a base voltage signal $V_{B2}$.

The collector currents of the transistors Q1–Q4 are $I_{C1}$, $I_{C2}$, $I_{C3}$ and $I_{C4}$, respectively. The current through the resister R1 is $I_{R1}$ and the current through the resister R2 is $I_{R2}$. The bias resistors R3–R6 are large compared to the impedance looking into the base of each of the transistors Q1–Q4. At RF frequencies, the transistor base impedance is mostly capacitive, referred to as $C_{JEX}$, where "X" is an integer from 1 to 4 that denotes a respective one of the transistors Q1–Q4. The summing network 301 is used as a wide band voltage divider and voltage summer. The summing network 301 blocks any direct current (DC) to the inputs of the quadrature oscillator 227. The filter capacitor C9 and C10 divert alternating current (AC) back to ground so that only DC current flows through the bias resisters R1 and R2 producing the phase error signal.

The AC voltages at the inputs I+ and Q+ are $V_{I+}$ and $V_{Q+}$ respectively. The AC voltages at the I− and Q− inputs are $V_{I-}$ and $V_{Q-}$ respectively. The base voltages $V_{BE1}$ applied to the base of the transistor Q1 is provided by the following equation 1:

$$V_{BE1} = V_{BIAS} + \frac{C1}{C1+C2+C_{JE1}}V_{I+} + \frac{C2}{C1+C2+C_{JE1}}V_{Q+} \quad (1)$$

The base voltages of each of the remaining transistors Q2–Q4 are determined with equations similar to equation 1 except with substitution of variables. For example, the base voltage $V_{BE2}$ is determined with equation 1 by substituting the variables $V_{BE1}$, C1, C2, $C_{JE1}$ and $V_{Q+}$ with variables $V_{BE2}$, C7, C8, $C_{JE2}$, and $V_{Q-}$, respectively. The base voltages $V_{BE3}$ and $V_{BE4}$ are found in a similar manner. The DC phase error voltage is provided by the following equation 2:

$$V_{OUT+} - V_{OUT-} = (R2)(I_{C2[avg]} + I_{C4[avg]}) - (R1)(I_{C1[avg]} + I_{C3[avg]}) \quad (2)$$

where $I_{C1}[avg]$, $I_{C2}[avg]$, $I_{C3}[avg]$ and $I_{C4}[avg]$ are the average or DC collector currents through the respective transistors Q1–Q4.

Figure 4:
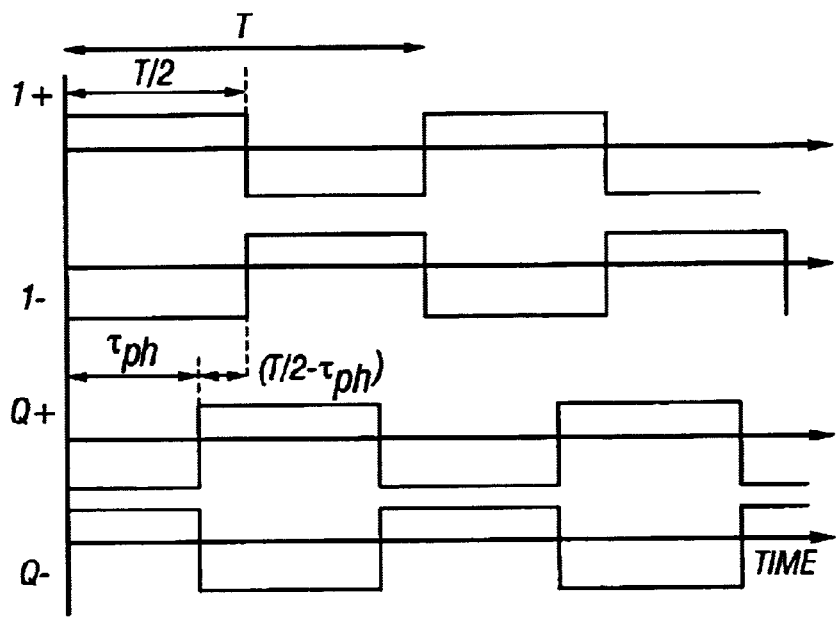
FIG. 4 is a graph diagram of the carrier signals in idealized form with DC removed and plotted versus time with the I/Q phase delay being the only variable.

FIG. 4 is a graph diagram of the I+, I−, Q+ and Q− carrier signals in idealized form with DC removed and plotted versus time with the I/Q phase delay being the only variable. The waveforms are idealized in that each signal is a squarewave and has precisely a 50% duty cycle, the I+ and I− signals are precisely 180 degrees out of phase with respect to each other and the Q+ and Q− signals are precisely 180 degrees out of phase with respect to each other. The period "T" of each of the I and Q waveforms are equal to each other. The Q+ and Q− signals are delayed from the I inputs by a phase "$t_{ph}$" (where "t" is shown as the Greek tau symbol or "τ" in the Figures), which is ideally one-quarter of a period (T/4) or 90 degrees. Thus, the positive pulse width of each of the waveforms is T/2. The delay from the rising edge of the Q+ signal (or the falling edge of the Q− signal) to the falling edge of the I+ signal (or the rising edge of the I− signal) is equal to $T/2 - t_{ph}$, which is intended to be equal to $t_{ph}$.

Figure 5:
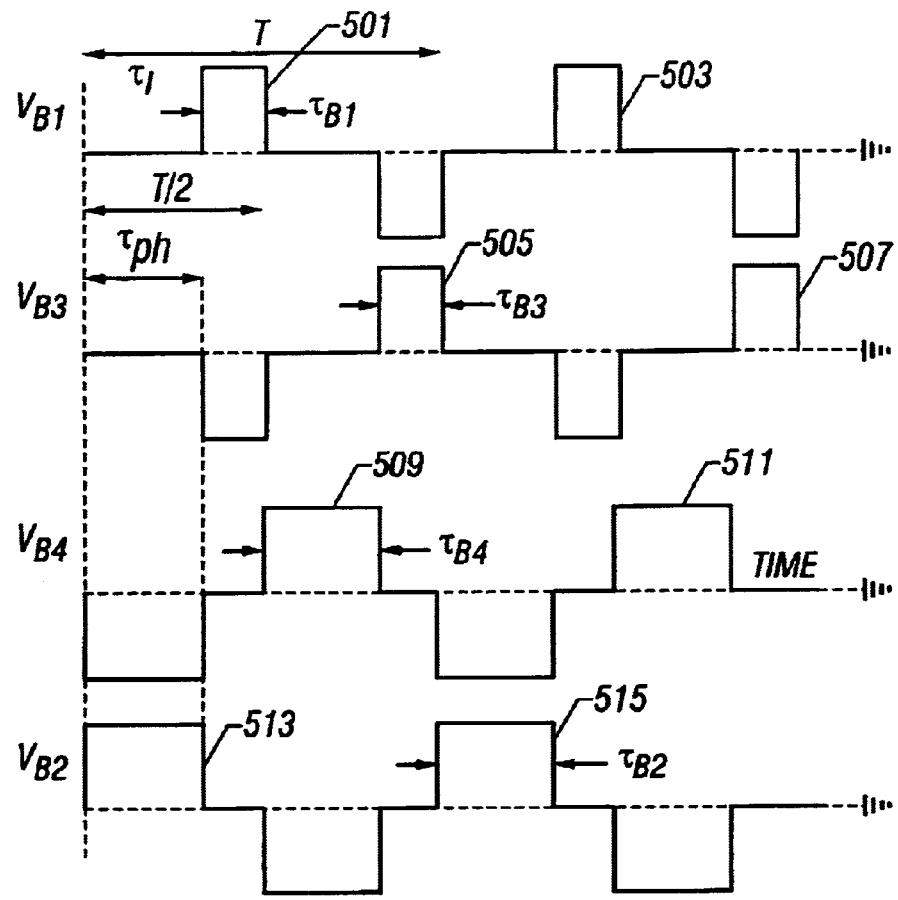
FIG. 5 is a graphic diagram illustrating idealized waveforms for the transistor base voltages plotted versus time in response to the carrier signals of FIG. 4.

FIG. 5 is a graphic diagram illustrating idealized waveforms for the $V_{B1}$, $V_{B3}$, $V_{B4}$ and $V_{B2}$ signals plotted versus time in response to the I+, I−, Q+ and Q− input carrier signals shown in FIG. 4. For purposes of illustration, it is assumed that the phase error detector 300 includes matching components to achieve symmetry, so that the capacitors C1–C8 match, the capacitors C9 and C10 match, the resistors R1 and R2 match, the resistors R3–R6 match, and transistors Q1–Q4 match. Second, it is recognized that there is an exponential relationship between the $V_{B1}$–$V_{B4}$ signals and the corresponding collector currents $I_{C1}$–$I_{C4}$ of the transistors Q1–Q4. In a particular embodiment at room temperature, for example, the collector current increases by a factor of ten (10) when the base to emitter voltage of the transistors Q1–Q4 increase by approximately 60 millivolts (mV). The VBIAS signal turns the transistors Q1–Q4 on at a very low value. The only significant level of collector current occurs when both of the base inputs are high. The voltage at the base of the transistor Q1 is the sum of the I+ and Q+ inputs, the voltage at the base of the transistor Q3 is the sum of the I− and Q− inputs, the voltage at the base of the transistor Q2 is a sum of the I+ and Q− inputs, and the voltage at the base of the transistor Q4 is the sum of the I− and Q+ inputs. Thus, assume that the transistor Q1 turns on only when both the I+ and Q+ signals are high pulling $V_{B1}$ high, the transistor Q2 turns on only when the input I+ and Q− are high pulling $V_{B2}$ high, the transistor Q3 turns on only when the inputs Q− and I− are high pulling $V_{B3}$ high and the transistor Q4 turns on only when the inputs Q+ and I− are high pulling $V_{B4}$ high.

As shown at 501 and 503, the transistor Q1 is turned on for the pulse width period $t_{B1}$ while $V_{B1}$ is asserted positive. Likewise, the transistor Q3 is turned on for a pulse with period $t_{B3}$ while $V_{B3}$ is asserted positive as shown at 505 and 507. The following equation 3 indicates the relationship of $t_{B1}$ and $t_{B3}$ with respect to the period T and the phase $t_{ph}$:

$$t_{B1} = t_{B3} = T/2 - t_{ph} \quad (3)$$

In a similar manner, the transistor Q4 is turned on while the $V_{B4}$ signal is positive as shown at 509 and 511 for a pulse width time period $t_{B4}$. Also, the transistor Q2 is turned on while the $V_{B2}$ signal is positive as shown at 513 and 515 for a positive base voltage pulse width of $t_{B2}$. The positive base voltage pulse widths $t_{B2}$ and $t_{B4}$ are related to the quadrature phase delay $t_{ph}$ according to the following equation 4:

$$t_{B2}=t_{B4}=t_{ph} \tag{4}$$

It is appreciated that the average collector current for each of the transistors Q1–Q4 is directly related to the corresponding $V_{B1}$–$V_{B4}$ signals, which are further directly related to the positive base voltage pulse widths $t_{B1}$–$t_{B4}$. Assuming that $t_{ph}$ is equal to 90 degrees or exactly one-quarter period (T/4), then the positive base voltage pulse widths $t_{B1}$–$t_{B4}$ are equal to each other. Further, assuming idealized conditions in which the magnitudes of the $V_{B1}$–$V_{B4}$ signals are the same, then the average collector currents $I_{C1}[avg]$–$I_{C4}[avg]$ of the transistors Q1–Q4 are the same, so that the $V_{OUT}$ phase error signal is equal to zero with reference to equation 2. Also, the average collector current increases with increasing pulse widths assuming the same amplitudes. Thus, if the Q carrier signals are more than a quarter period delayed such that $t_{ph}$ becomes greater than T/4, then the positive base voltage pulse widths $t_{B2}$ and $t_{B4}$ of the corresponding transistors Q2 and Q4 become longer than a quarter of a period while the positive base voltage pulse widths $t_{B1}$ and $t_{B3}$ for the corresponding transistors Q1 and Q3 become shorter than a quarter period. In that case, the average collector currents $I_{C2}[avg]$ and $I_{C4}[avg]$ become greater than the collector currents $I_{C1}[avg]$ and $I_{C3}[avg]$, so that the $V_{OUT}$ signal becomes positive. In a similar manner, if $t_{ph}$ becomes shorter than a quarter of a period or $t_{ph}<T/4$, then the positive base voltage pulse widths $t_{B1}$ and $t_{B3}$ of the corresponding transistors Q1 and Q3 become greater than the positive base voltage pulse widths $t_{B2}$ and $t_{B4}$ of the corresponding transistors Q2 and Q4, so that the corresponding average collector currents $I_{C1}[avg]$ and $I_{C3}[avg]$ become greater than the collector currents $I_{C2}[avg]$ and $I_{C4}[avg]$. In that case, the $V_{OUT}$ signal goes negative.

In sum, the phase error detector 300 asserts the $V_{OUT+}$, $V_{OUT-}$ signals as the difference in average collector current of the transistors Q1 and Q3 as compared to the transistors Q2 and Q4. The quadrature oscillator 227 responds to the $V_{OUT+}$, $V_{OUT-}$ signals (in the form of the $E_{R+}$, $E_{R-}$ signals or the $E_{T+}$, $E_{T-}$ signals or the like and adjusts the quadrature phase differential between the I and Q signals to correct for phase error. The output polarity depends upon whether the Q signal delay is longer or shorter than a quarter period. The output magnitude depends on how much the quadrature phase $t_{ph}$ deviates from a quarter period.

Figure 6:
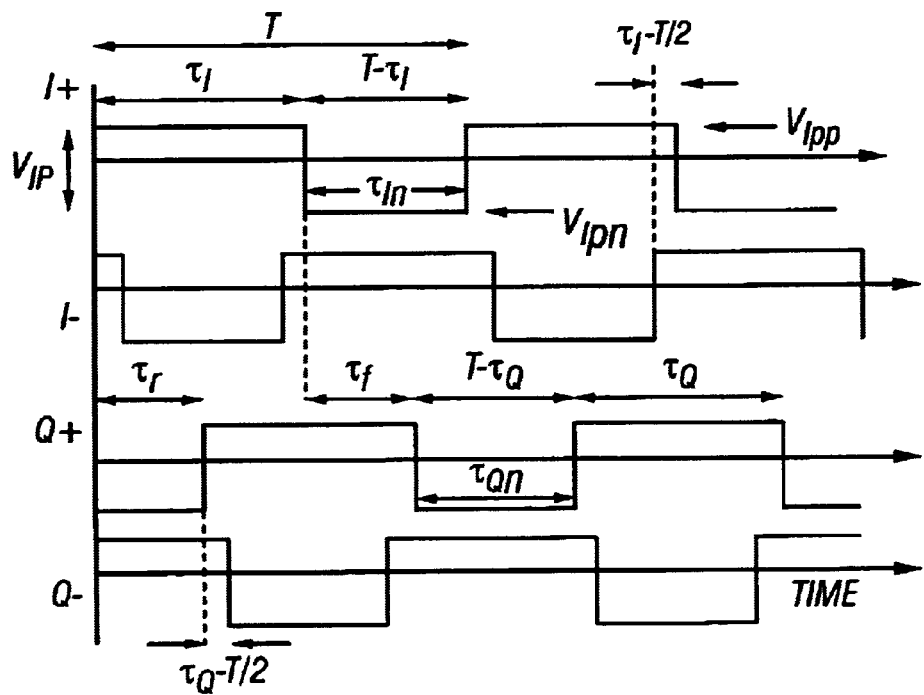
FIG. 6 is a graph diagram showing idealized I and Q carrier signals with pulse width variations to illustrate particular sources of inaccuracy.

FIG. 6 is a graph diagram showing idealized carrier waveforms with pulse width variations to illustrate particular sources of inaccuracy. If the average I/Q positive pulse width is longer than half a period, the positive pulse width at the transistor bases are longer than a quarter of a period. This condition, however, does not generate a differential output voltage, so that the assumed common mode second harmonic does not generate a false phase error signal. It is assumed that the I+, I−, Q+ and Q− signals are square waves having a period T and peak-to-peak amplitudes of $V_{Ip}$, $V_{In}$, $V_{Qp}$ and $V_{Qn}$, respectively. The I+ signal, for example, varies between voltages $V_{Ipp}$ and $V_{Ipn}$. The I+ and Q+ inputs have positive pulse widths of $t_I$ and $t_Q$ and negative pulse widths of $t_{In}$ and $t_{Qn}$, respectively. Ideally, the I+, I−, Q+ and Q− signals are very symmetric, with equal positive and negative amplitudes and with 50% duty cycle each. The presence of common mode voltages at the second harmonic, however, can cause individual signals to deviate from the ideal 50% duty cycle. As shown in FIG. 6, for example, the positive pulse width $t_I$ of the I signals is greater than the negative pulse width $t_{In}$ and the positive pulse width $t_Q$ of the Q signals is greater than the negative pulse width $t_{Qn}$.

The I/Q phase delay $t_{ph}$ is usually measured from the zero crossings of differential signals. There is not as well a defined reference, however, for the individual signals. The phase delay can be measured from the center of the I+ positive pulse to the center of the Q+ positive pulse or by taking the average of the delays between the rising edges and falling edges as illustrated with equation 5:

$$t_{ph} = \frac{t_r + t_f}{2} \tag{5}$$

where $t_r$ is the delay of the rising edge of Q+ with respect to the rising edge of I+ and $t_f$ is the delay of the falling edge of the Q+ signal with respect to the falling edge of the I+ signal. The following equation 6 illustrates that not all defined time periods are independent:

$$t_r+t_f=t_Q+t_r,\ t_f-t_Q=t_r-t_f \tag{6}$$

The following equation 7 defines the negative pulse width $t_{In}$ of the I signal in relation to the period T and the positive pulse width $t_I$:

$$t_{In}=T-t_I \tag{7}$$

The following equation 8 describes the pulse width difference of the I signal:

$$t_I-t_{In}=t_I-(T-t_I)=2t_I-T \tag{8}$$

Figure 7:
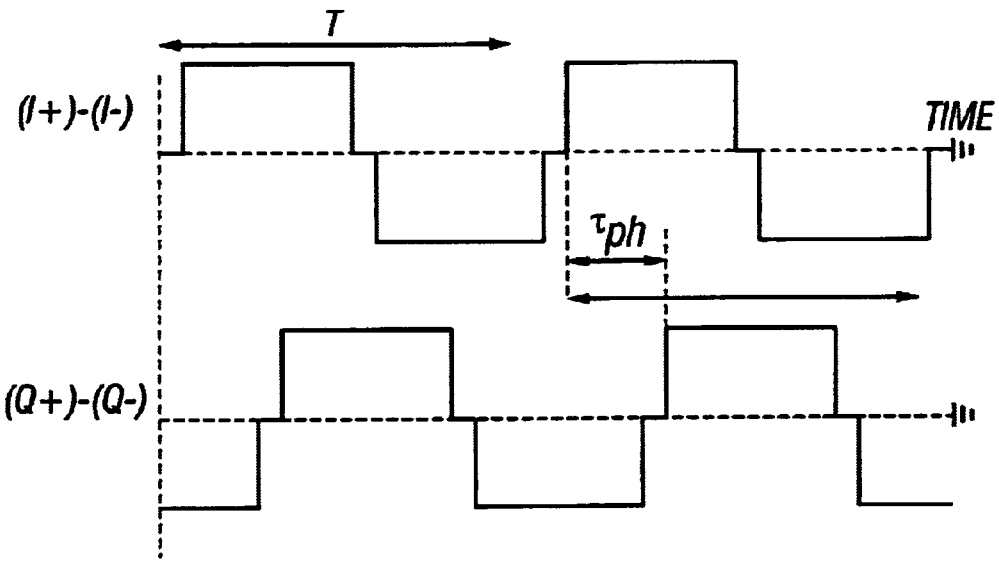
FIG. 7 is a graph diagram of differential carrier signals in accordance with the I and Q carrier signals of FIG. 6.

FIG. 7 is a graph diagram of the differential I [(I+)−(I−)] and Q [(Q+)−(Q−)] signals in accordance with the carrier signals of FIG. 6. As illustrated, the assumed symmetry of the I and Q signals means that the I+/I− and Q+/Q− zero crossings are separated by half the difference between the positive and negative pulse widths, which is also equal to the difference between the positive pulse width and half of the period T. Equation 9 defines the average I/Q pulse width:

$$t_{PW} = \frac{t_I + t_Q}{2} \tag{9}$$

The I/Q pulse width difference, $t_{PWD}$, is defined in the following equation 10:

$$t_{PWD}=t_I-t_Q \tag{10}$$

Thus, the delay of the rising edge of Q+ with respect to the rising edge of I+, or $t_r$, is defined in the following equation 11 with respect to $t_{PWD}$ and $t_{ph}$:

$$t_r = \frac{t_{ph} + t_{PWD}}{2} \tag{11}$$

and the delay of the falling edges of the Q+ signal relative to the I+ signal, or $t_f$ is defined in the following equation 12 with respect to $t_{PWD}$ and $t_{ph}$:

$$t_f = t_{ph} - \frac{t_{PWD}}{2} \quad (12)$$

Figure 8:
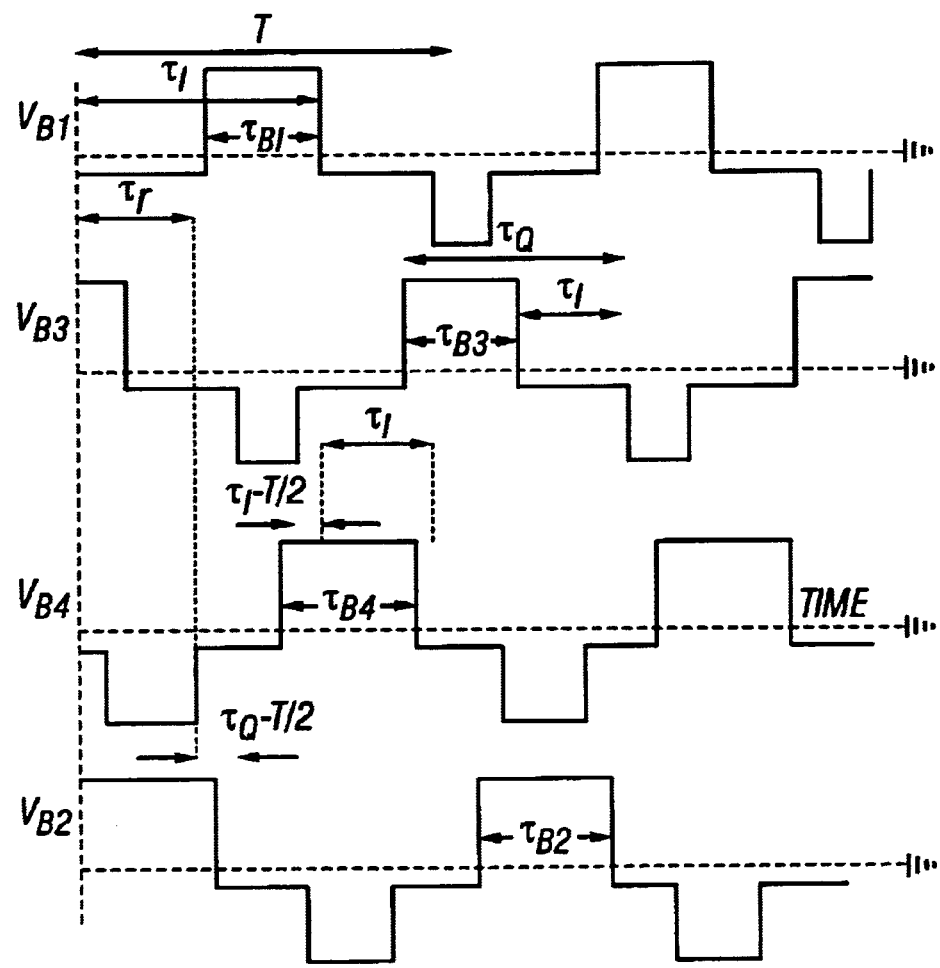
FIG. 8 is a graph diagram of the resulting transistor base voltages in response to the I and Q carrier signals of FIG. 6.

FIG. 8 is a graph diagram of the $V_{B1}$, $V_{B3}$, $V_{B4}$ and $V_{B2}$ signals in response to the I and Q carrier signals of FIG. 6. The following equations 13–16 define the positive pulse widths $t_{B1}$, $t_{B3}$, $t_{B2}$ and $t_{B4}$ of the $V_{B1}$, $V_{B3}$, $V_{B2}$ and $V_{B4}$ signals, respectively:

$$t_{B1}=t_I-t_r=(t_{PW}+t_{PWD}/2)-(t_{ph}+t_{PWD}/2)=t_{PW}-t_{ph} \quad (13)$$

$$t_{B3}=t_Q-t_r=(t_{PW}-t_{PWD}/2)-(t_{ph}-t_{PWD}/2)=t_{PW}-t_{ph} \quad (14)$$

$$t_{B2}=t_r+(t_Q-T/2)=(t_{ph}+t_{PWD}/2)+[(t_{PW}-t_{PWD}/2)-T/2]=t_{PW}+t_{ph}-T/2 \quad (15)$$

$$t_{B4}=t_f+(t_I-T/2)=(t_{ph}-t_{PWD}/2)+[(t_{PW}+t_{PWD}/2)-T/2]=t_{PW}+t_{ph}-T/2 \quad (16)$$

Since the capacitors C9, C10 block DC voltages of the transistors Q1–Q4, the positive amplitudes above the $V_{BIAS}$ signal at the transistor bases are scaled by duty cycles as illustrated by the following equations 17–19:

$$(V_{Ipp})(t_1)=(|V_{Ipn}|)(T-t_1) \quad (17)$$

$$V_{Ipp}+|V_{Ipn}|=V_{Ip} \quad (18)$$

$$V_{Ipp}=[(T-t_1)/T](V_{Ip})=[(T-t_{PW}-t_{PWD}/2)/T](V_{Ip}) \quad (19)$$

FIG. 9 is a table that summarizes the positive amplitude excursion above the $V_{BIAS}$ signal and the duration of the pulse for each of the $V_{B1}$, $V_{B3}$, $V_{B2}$ and $V_{B4}$ signals.

In summary, if the Q signal lags the I signal by more than a quarter period, the transistors Q2 and Q4 are on longer than the transistors Q1 and Q3, and vice-versa, so that there is a differential phase error signal as intended. If the average I/Q positive pulse width is longer than half a period, the positive pulse width at the transistor bases are longer than a quarter of a period. This condition, however, does not generate a differential output voltage, so that the assumed common mode second harmonic does not generate a false phase error signal.

Base voltage amplitude errors are another potential source of false phase error. A reasonable model for the quadrature oscillator and its outputs is to assume it behaves like a resistor/capacitor (R/C) low pass filter. If the Q chain has a slightly lower cutoff frequency than the I chain, such as, for example, due to higher parasitic capacitance, then the Q signal is delayed more than the I signal and the Q amplitude is attenuated more than the I signal. So it is reasonable to expect that there are amplitude differences between the I and Q signals. As long as there is amplitude matching between the I+/I− and Q+/Q− pairs, however, a false phase error signal does not result.

It is appreciated that a phase error detector according to the present invention is relatively simple and includes very few active components and is operable at high frequencies including the intended RF operation. The phase error detector detects deviations in phase from the desired quadrature phase differential with first order immunity to common mode voltages or I/Q amplitude imbalances. It is noted that many variations of the phase error detector 300 are possible and contemplated. For example, the resistors R3–R6 may comprise current sources or inductors. The resistors R1 and R2 may be inductors or both may be replaced by a current mirror. The embodiment shown is illustrated with NPN bipolar junction transistors, although it is understood that other types of transistors and transistor technology may be employed, such as PNP or metal oxide semiconductor (MOS) type or field effect transistors (FETs) or the like. The filter capacitors C9 and C10 may be replaced by any type of suitable filter, including more sophisticated filters or the like. The summing network 301 may use any type of impedance element other than the capacitors C1–C8 shown.

Although a system and method according to the present invention has been described in connection with one or more embodiments of the invention, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A phase error detector for detecting and correcting phase error between positive and negative polarities of a first and second differential signals, the phase error detector comprising:
   a summing network that develops a first sum signal by summing the positive polarity signals of the first and second differential signals, a second sum signal by summing the negative polarity signals of the first and second differential signals, a third sum signal by summing the positive polarity signal of the first differential signal with the negative polarity signal of the second differential signal, and a fourth sum signal by summing the negative polarity signal of the first differential signal with the positive polarity signal of the second differential signal;
   a first mixer circuit, coupled to the summing network, that develops a first polarity signal of the phase error signal based on the first and second sum signals; and
   a second mixer circuit, coupled to the summing network, that develops a second polarity signal of the phase error signal based on the third and fourth sum signals.

2. The phase error detector circuit of claim 1, further comprising:
   the summing network removing DC from the first, second, third and fourth sum signals;
   the first mixer circuit responsive to the positive portion of the first and third sum signals and developing the first polarity signal of the phase error signal as a combined signal; and
   the second mixer circuit responsive to the positive portion of the second and fourth sum signals and developing the second polarity signal of the phase error signal as a combined signal.

3. The phase error detector circuit of claim 1, wherein the summing network comprises an impedance bridge network.

4. The phase error detector circuit of claim 3, wherein the impedance bridge network comprises:
   first, second, third and fourth capacitive legs coupled together at first, second, third and fourth primary junctions, wherein the positive polarity signal of the first differential signal is received at the first primary junction coupling the first and fourth capacitive legs, the negative polarity signal of the first differential signal is received at the third primary junction coupling the second and third capacitive legs, the positive polarity signal of the second differential signal is received at the second primary junction coupling the first and second capacitive legs, and the negative polarity signal of the second differential signal is received at the fourth primary junction coupling the third and fourth capacitive legs;
   the first capacitive leg including two capacitors coupled together at a first intermediate junction for providing the first sum signal;

the second capacitive leg including two capacitors coupled together at a second intermediate junction for providing the fourth sum signal;

a third capacitive leg including two capacitors coupled together at a third intermediate junction for providing the third sum signal; and a fourth capacitive leg including two capacitors coupled together at a fourth intermediate junction for providing the second sum signal.

5. The phase error detector circuit of claim 4, wherein the two capacitors of each capacitive leg of the impedance bridge network are matched with each other.

6. The phase error detector circuit of claim 4, further comprising:

four bias devices, each coupled between a bias signal and a respective one of the intermediate junctions of the capacitive legs of the impedance bridge network.

7. The phase error detector circuit of claim 6, wherein the four bias devices comprise resistors.

8. The phase error detector circuit of claim 4, wherein:

the first mixer circuit includes a first matched pair of bipolar transistors with common-coupled collectors, the base of each transistor of the first matched pair receiving one of the first and third sum signals, and the common-coupled collectors of the first matched pair developing the first polarity signal of the phase error signal; and wherein the second mixer circuit includes a second matched pair of bipolar transistors with common-coupled collectors, the base of each transistor of the second matched pair receiving one of the second and fourth sum signals, and the common-coupled collectors of the second matched pair developing the second polarity signal of the phase error signal.

9. The phase error detector circuit of claim 8, further comprising:

a matched pair of bias resistors, each coupled between a power supply signal and a respective one of the common-coupled collectors of the first and second matched pairs of bipolar transistors.

10. The phase error detector circuit of claim 8, further comprising:

a matched pair of filter capacitors, each coupled between the common-coupled collectors and emitters of a respective one of the first and second matched pairs of bipolar transistors.

11. A quadrature generator system with phase error detection feedback, comprising:

a quadrature generator that develops positive and negative square-wave in-phase (I) carrier signals and positive and negative square-wave quadrature phase (Q) carrier signals and that receives a differential phase error signal for correcting phase error between the I and Q carrier signals; and a phase error detector, comprising:

a summing circuit that develops a first sum signal by summing the positive I and Q carrier signals, a second sum signal by summing the negative I and Q carrier signals, a third sum signal by summing the positive I carrier signal and the negative Q carrier signal, and a fourth sum signal by summing the negative I carrier signal and the positive Q carrier signal;

a first mixer circuit, coupled to the summing network, that combines the first and second sum signals and develops a first polarity signal of the differential phase error signal; and a second mixer circuit, coupled to the summing network, that combines the third and fourth sum signals and develops a second polarity signal of the differential phase error signal.

12. The quadrature generator system of claim 11, wherein the summing circuit comprises an impedance bridge.

13. The quadrature generator system of claim 12, wherein the impedance bridge comprises:

first, second, third and fourth capacitive legs coupled together at first, second, third and fourth primary junctions, wherein the positive I carrier signal is received at the first primary junction coupling the first and fourth capacitive legs, the negative I carrier signal is received at the third primary junction coupling the second and third capacitive legs, the positive Q carrier signal is received at the second primary junction coupling the first and second capacitive legs, and the negative Q carrier signal is received at the fourth primary junction coupling the third and fourth capacitive legs;

the first capacitive leg including two capacitors coupled together at a first intermediate junction for providing the first sum signal;

the second capacitive leg including two capacitors coupled together at a second intermediate junction for providing the fourth sum signal;

a third capacitive leg including two capacitors coupled together at a third intermediate junction for providing the third sum signal; and a fourth capacitive leg including two capacitors coupled together at a fourth intermediate junction for providing the second sum signal.

14. The quadrature generator system of claim 11, further comprising:

the summing circuit removing DC from the first, second, third and fourth sum signals;

the first mixer circuit combining the positive portion of the first and third sum signals to develop the first polarity signal of the differential phase error signal; and the second mixer circuit combining the positive portion of the second and fourth sum signals to develop the second polarity signal of the differential phase error signal.

15. The quadrature generator system of claim 11, further wherein:

the first mixer circuit includes a first matched pair of bipolar transistors with common-coupled collectors, the base of each transistor of the first matched pair receiving one of the first and third sum signals, and the common-coupled collectors of the first matched pair developing the first polarity signal of the differential phase error signal; and wherein the second mixer circuit includes a second matched pair of bipolar transistors with common-coupled collectors, the base of each transistor of the second matched pair receiving one of the second and fourth sum signals, and the common-coupled collectors of the second matched pair developing the second polarity signal of the differential phase error signal.

16. The quadrature generator system of claim 15, further comprising:

a matched pair of bias resistors, each coupled between a power supply signal and a respective one of the common-coupled collectors of the first and second matched pairs of bipolar transistors; and four matched bias resistors, each coupled between a bias signal and a respective one of the bases of the first and second matched pair of bipolar transistors.

17. The quadrature generator system of claim 16, further comprising:

a matched pair of filter capacitors, each coupled between the common-coupled collectors and emitters of a respective one of the first and second matched pairs of bipolar transistors.

18. A radio transceiver, comprising:

an antenna;

a radio frequency (RF) receive circuit that detects a received RF signal via the antenna;

a first receive mixer, coupled to the RF receive circuit, that mixes the received RF signal with positive and negative in-phase (I) carrier signals and that develops an I receive signal;

a second receive mixer, coupled to the RF receive circuit, that mixes the received RF signal with positive and negative quadrature phase (Q) carrier signals and that develops a Q receive signal; and a quadrature oscillator with phase error detection feedback that provides the positive and negative I and Q carrier signals, comprising:

a quadrature local oscillator that develops the positive and negative I carrier signals and the positive and negative Q carrier signals and that receives a differential phase error signal for maintaining the I and Q carrier signals at a one-quarter period phase differential with respect to each other; and a phase error detector, comprising:

a summing circuit that develops a first sum signal by summing the positive I and Q carrier signals, that develops a second sum signal by summing the negative I and Q carrier signals, that develops a third sum signal by summing the positive I carrier signal and the negative Q carrier signal, and that develops a fourth sum signal by summing the negative I carrier signal and the positive Q carrier signal;

a first mixer circuit, coupled to the summing network, that combines the first and second sum signals to develop a first polarity signal of the differential phase error signal; and a second mixer circuit, coupled to the summing network, that combines the third and fourth sum signals to develop a second polarity signal of the differential phase error signal.

19. The radio transceiver of claim 18, further comprising:

the summing circuit comprising a matched impedance bridge;

the first mixer circuit including a first matched pair of bipolar transistors coupled together at their respective emitters and collectors and a bias device coupled between a supply signal and common collectors of the first matched pair of bipolar transistors; and the second mixer circuit including a second matched pair of bipolar transistors coupled together at their respective emitters and collectors and a bias device coupled between a supply signal and common collectors of the second matched pair of bipolar transistors.

20. A method of providing a phase error signal indicative of any phase error phase error between positive and negative polarities of a first and second differential signals, comprising:

combining positive polarity signals of the first and second differential signals and providing a first sum;

combining negative polarity signals of the first and second differential signals and providing a second sum;

combining a first positive polarity signal and a first negative polarity signal of the first and second differential signals and providing a third sum;

combining a second positive polarity signal and a second negative polarity signal of the first and second differential signals and providing a fourth sum;

mixing the first and third sums to generate a first polarity phase error signal;

mixing the second and fourth sums to generate a second polarity phase error signal; and providing the phase error signal as the difference between the first and second polarity phase error signals.

21. The method of claim 20, wherein each combining comprises summing of signals.

22. The method of claim 20, further comprising:

removing DC from the first, second, third and fourth sums prior to mixing.

23. The method of claim 20, further comprising:

the mixing the first and third sums comprising generating a first signal responsive to a positive portion of the first sum and generating a second signal responsive to a positive portion of the third sum;

combining the first and second signals to achieve the first polarity phase error signal;

the mixing the second and fourth sums comprising generating a third signal responsive to a positive portion of the second sum and generating a fourth signal responsive to a positive portion of the fourth sum; and combining the third and fourth signals to achieve the second polarity phase error signal.

* * * * *